US012581667B2

(12) United States Patent  
Rubin et al.

(10) Patent No.: US 12,581,667 B2  
(45) Date of Patent: Mar. 17, 2026

(54) MULTISTACK METAL-INSULATOR-METAL (MIM) STRUCTURE USING SPACER FORMATION PROCESS FOR HETEROGENEOUS INTEGRATION WITH DISCRETE CAPACITORS

(71) Applicant: International Business Machines Corporation, Armonk, NY (US)

(72) Inventors: Joshua M. Rubin, Albany, NY (US); Christopher J. Penny, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 629 days.

(21) Appl. No.: 18/092,162

(22) Filed: Dec. 30, 2022

(65) Prior Publication Data

US 2024/0222422 A1 Jul. 4, 2024

(51) Int. Cl.  
*H10D 1/00* (2025.01)  
*H01L 23/522* (2006.01)  
*H10D 1/68* (2025.01)

(52) U.S. Cl.  
CPC ......... *H10D 1/043* (2025.01); *H01L 23/5226* (2013.01); *H10D 1/696* (2025.01); *H10D 1/714* (2025.01); *H10D 1/716* (2025.01)

(58) Field of Classification Search  
CPC .......... H10D 1/043; H10D 1/42; H10D 1/714; H10D 1/696; H01L 23/5223; H01L 21/76831; H01L 21/76805; H01L 23/5226  
See application file for complete search history.

(56) References Cited

U.S. PATENT DOCUMENTS

| | | | |
|---|---|---|---|
| 5,155,657 | A | 10/1992 | Oehrlein et al. |
| 5,399,518 | A | 3/1995 | Sim |
| 6,346,455 | B1 | 2/2002 | Thakur et al. |
| 6,532,143 | B2 | 3/2003 | Figueroa |
| 7,338,879 | B2 | 3/2008 | Won |

(Continued)

OTHER PUBLICATIONS

Ni, S. et al., "Wafer-scale 3D shaping of high aspect ratio structures by multistep plasma etching and corner lithography", Microsystems & Nanoengineering2020), vol. 6:1, pp. 1-11.

(Continued)

*Primary Examiner* — Jose R Diaz  
(74) *Attorney, Agent, or Firm* — Yuanmin Cai; Otterstedt & Kammer PLLC

(57) ABSTRACT

A multi-stack metal-insulator-metal (MIM) structure includes a plurality of conductive plates including a first group comprising odd-numbered ones of the plates and a second group comprising even-numbered ones of the plates. All of the conductive plates are of an identical material. A plurality of insulators are between the plurality of conductive plates; and a first plate via contact extends vertically through the plurality of conductive plates and the plurality of insulators. The first plate via contact is electrically coupled to the first group of conductive plates and electrically isolated from the second group of conductive plates. The second plate via contact extends vertically through the plurality of conductive plates and the plurality of insulators. The second plate via contact is electrically coupled to the second group of conductive plates and electrically isolated from the first group of conductive plates.

20 Claims, 7 Drawing Sheets

(56) References Cited

U.S. PATENT DOCUMENTS

| | | | |
|---|---|---|---|
| 8,008,161 B2 | 8/2011 | Bachmann | |
| 9,142,557 B2 | 9/2015 | Lee | |
| 9,391,016 B2 * | 7/2016 | Shen | H01L 21/76802 |
| 9,570,575 B1 | 2/2017 | Balakrishnan et al. | |
| 10,211,147 B2 | 2/2019 | Zhang | |
| 10,461,148 B1 * | 10/2019 | Reznicek | H10D 1/043 |
| 10,615,133 B2 | 4/2020 | Kamgaing | |
| 10,734,475 B2 | 8/2020 | Ando | |
| 11,081,543 B2 | 8/2021 | Reznicek et al. | |
| 11,139,368 B2 | 10/2021 | Chern et al. | |
| 11,276,748 B2 | 3/2022 | Li | |
| 11,296,090 B2 | 4/2022 | Chern et al. | |
| 2012/0049262 A1 | 3/2012 | Huang et al. | |
| 2015/0206662 A1 | 7/2015 | Lamy et al. | |
| 2018/0212019 A1 | 7/2018 | Adusumilli | |
| 2019/0074349 A1 | 3/2019 | Lin et al. | |
| 2020/0227348 A1 | 7/2020 | Lin | |
| 2021/0036096 A1 * | 2/2021 | Li | H01L 23/5226 |
| 2022/0189702 A1 | 6/2022 | Shimizu et al. | |
| 2022/0254714 A1 | 8/2022 | Lu et al. | |
| 2022/0285480 A1 | 9/2022 | Kalnitsky et al. | |
| 2022/0310507 A1 | 9/2022 | Kao et al. | |
| 2022/0406706 A1 * | 12/2022 | Hsueh | H01L 23/5223 |
| 2023/0019688 A1 | 1/2023 | Kao et al. | |
| 2023/0098594 A1 | 3/2023 | Lin et al. | |
| 2023/0178587 A1 | 6/2023 | Frougier et al. | |
| 2023/0275044 A1 | 8/2023 | Lundahl | |
| 2023/0395648 A1 | 12/2023 | Lin et al. | |
| 2025/0006780 A1 | 1/2025 | Rubin et al. | |

OTHER PUBLICATIONS

Frédéric Nodet. Low Profile and Multi Terminal Silicon Capacitors. PowerSoc 2018, pp. 22.

James D. Plummer et al., Silicon VLSI Technology: Fundamentals, Practice, and Modeling 1st Edition, Prentice Hall, 2000, pp. 817.

P.H. Holloway et al., Handbook of Compound Semiconductors: Growth, Processing, Characterization, and Devices, Cambridge University Press, 2008. pp. 934.

United States Non-Final Rejection dated Oct. 29, 2025, 32 pages, in U.S. Appl. No. 18/346,125.

\* cited by examiner

MULTISTACK METAL-INSULATOR-METAL (MIM) STRUCTURE USING SPACER FORMATION PROCESS FOR HETEROGENEOUS INTEGRATION WITH DISCRETE CAPACITORS

BACKGROUND

The present invention relates generally to the electrical, electronic and computer arts and, more particularly, to integrated circuits (ICs) and the like.

The capacitance value of classical two-dimensional capacitors ("caps") depends on the electrode surface area (for a parallel plate capacitor, the capacitance is the area of the plates times the permittivity of the material separating the plates divided by the distance between them). Three-dimensional structures enable higher density capacitors, and may employ pillars or trenches. The vertical structure will, however, limit thickness scaling.

A Metal-Insulator-Metal (MIM) capacitor includes parallel plates formed by two metal planes separated by a thin dielectric; such capacitors are typically used in radio frequency (RF) circuits for oscillators, phase-shift networks, coupling, bypass capacitance, and the like. MIM capacitors are also useful for analog applications, because they are highly linear in nature and have a good dynamic range.

Current MIM capacitors include vias landing on MIM capacitor plates or vias penetrating MIM capacitor plates with sidewall contact. Both of these approaches require independent patterning of each MIM plate; for example, in a sequential process after each plate is deposited.

BRIEF SUMMARY

Principles of the invention provide techniques for a multi-stack metal-insulator-metal (MIM) structure using spacer formation process for heterogenous integration with discrete capacitors. In one aspect, an exemplary multi-stack metal-insulator-metal (MIM) structure includes a plurality of conductive plates including a first group comprising odd-numbered ones of the plates and a second group comprising even-numbered ones of the plates, all of the conductive plates being made of an identical material; a plurality of insulators between the plurality of conductive plates; a first plate via contact extending vertically through the plurality of conductive plates and the plurality of insulators, the first plate via contact being electrically coupled to the first group of conductive plates and electrically isolated from the second group of conductive plates; and second plate via contact extending vertically through the plurality of conductive plates and the plurality of insulators, the second plate via contact being electrically coupled to the second group of conductive plates and electrically isolated from the first group of conductive plates.

In another aspect, another exemplary multi-stack metal-insulator-metal (MIM) structure includes a plurality of conductive plates including a first group comprising odd-numbered ones of the plates and a second group comprising even-numbered ones of the plates; a plurality of insulators between the plurality of conductive plates; a first plate via contact extending vertically through the plurality of conductive plates and the plurality of insulators, the first plate via contact being electrically coupled to the first group of conductive plates and electrically isolated from the second group of conductive plates; a second plate via contact extending vertically through the plurality of conductive plates and the plurality of insulators, the second plate via contact being electrically coupled to the second group of conductive plates and electrically isolated from the first group of conductive plates; first and second pluralities of dielectric spacers, wherein the first group of conductive plates are electrically isolated from the second plate via contact by the first plurality of dielectric spacers, and wherein the second group of conductive plates are electrically isolated from the first plate via contact by the second plurality of dielectric spacers; and first and second pluralities of metal liners, wherein the first group of conductive plates are electrically connected to the first plate via contact by the first plurality of metal liners, and wherein the second group of conductive plates are electrically connected to the second plate via contact by the second plurality of metal liners.

In still another aspect, a method for fabricating a multi-stack metal-insulator-metal (MIM) structure includes obtaining a precursor structure. The precursor structure includes a plurality of conductive plates, including a first group comprising odd-numbered ones of the plates and a second group comprising even-numbered ones of the plates; a plurality of insulators between the plurality of conductive plates; and an oxide hard mask outward of an outermost one of the plurality of conductive plates. Further steps include patterning and etching a contact opening for a second plate via contact; forming a lateral recess of a first width into the outermost one of the plurality of conductive plates; depositing a conformal dielectric layer on an outer surface of the precursor structure, sides of the contact opening, and surfaces of the lateral recess; and etching the conformal dielectric layer on exposed horizontal surfaces thereof. Further steps include patterning and etching a contact opening for a first plate via contact; and forming a lateral recess of a first width into the outermost one of the plurality of conductive plates through the contact opening for the first plate via contact and the next outermost one of the plurality of conductive plates through the contact opening for the second plate via contact, the second width being larger than the first width. At least the steps of forming the lateral recess of the first width and the lateral recess of the second width are repeated, for successively inward pairs of the plurality of conductive plates, until the second group of conductive plates have lateral recesses of the first width adjacent the contact opening for the second plate via contact and lateral recesses of the second width adjacent the contact opening for the first plate via contact, and the first group of conductive plates have lateral recesses of the first width adjacent the contact opening for the first plate via contact and lateral recesses of the second width adjacent the contact opening for the second plate via contact.

In a further aspect, another method for fabricating a multi-stack metal-insulator-metal (MIM) structure includes obtaining a precursor structure comprising: a plurality of conductive plates, including a first group comprising odd-numbered ones of the plates and a second group comprising even-numbered ones of the plates; a plurality of insulators between the plurality of conductive plates; and an oxide hard mask outward of an outermost one of the plurality of conductive plates. Further steps include patterning and etching a contact opening for a first plate via contact; forming a lateral recess of a given width into the outermost one of the plurality of conductive plates through the first plate via contact; depositing a conformal dielectric layer on an outer surface of the precursor structure, sides of the contact opening, and filling the lateral recess; etching the conformal dielectric layer on exposed horizontal surfaces thereof; and patterning and etching a contact opening for a second plate via contact. Further steps include forming a lateral recess of the given width into the outermost one of the plurality of conductive plates through the contact opening for the second plate via contact and the next outermost one of the plurality of conductive plates through the contact opening for the first plate via contact; and filling the lateral recess in the outermost one of the plurality of conductive plates that was formed through the contact opening for the second plate via contact and the lateral recess in the next outermost one of the plurality of conductive plates that was formed through the contact opening for the first plate via contact with oxide plugs. For successively inward pairs of the plurality of conductive plates, at least the steps of forming the lateral recess of the given width through the first plate via contact, depositing the conformal dielectric layer, forming the lateral recess of the given width into the outermost one of the plurality of conductive plates through the contact opening for the second plate via contact and the next outermost one of the plurality of conductive plates through the contact opening for the first plate via contact, and filling the lateral recess in the outermost one of the plurality of conductive plates that was formed through the contact opening for the second plate via contact and the lateral recess in the next outermost one of the plurality of conductive plates that was formed through the contact opening for the first plate via contact with oxide plugs, are repeated until the second group of conductive plates have lateral recesses filled with the oxide plugs adjacent the contact opening for the second plate via contact and lateral recesses filled with the conformal dielectric adjacent the contact opening for the first plate via contact, and the first group of conductive plates have lateral recesses filled with the oxide plugs adjacent the contact opening for the first plate via contact and lateral recesses filled with the conformal dielectric adjacent the contact opening for the second plate via contact. Further steps include removing the oxide plugs to form gaps; and filling the gaps with contact metal.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

A capacitor structure that can provide significantly more capacity density compared to the state of the art.

A capacitor structure that can be compatible with current packaging techniques.

A capacitor structure that can achieve extremely high capacitor density using large quantities of stacked MIM structures in a very thin form factor (for example, much thinner than Si caps based on pillar or trench structures).

A capacitor structure that can achieve future power integrity requirements for low profile high density capacitors for use on the bottom side of a substrate or embedded in a substrate.

A capacitor structure that can achieve low cost and be beneficial for mobile technologies, such as cell phones, as well as or high performance computing (HPC), such as high-performance central processing units (CPUs), graphics processing units (GPUs), hardware accelerators, and the like.

One or more embodiments do not require lithography at every plate patterning step.

One or more embodiments can use, by way of example and not limitation, on the order of dozens of plates.

One or more embodiments do not require a silicon substrate.

One or more embodiments are well-suited for heterogenous integration (HI) applications due to the potential for extremely high capacitor densities and the industry need for extremely high density capacitors with compact form factors.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
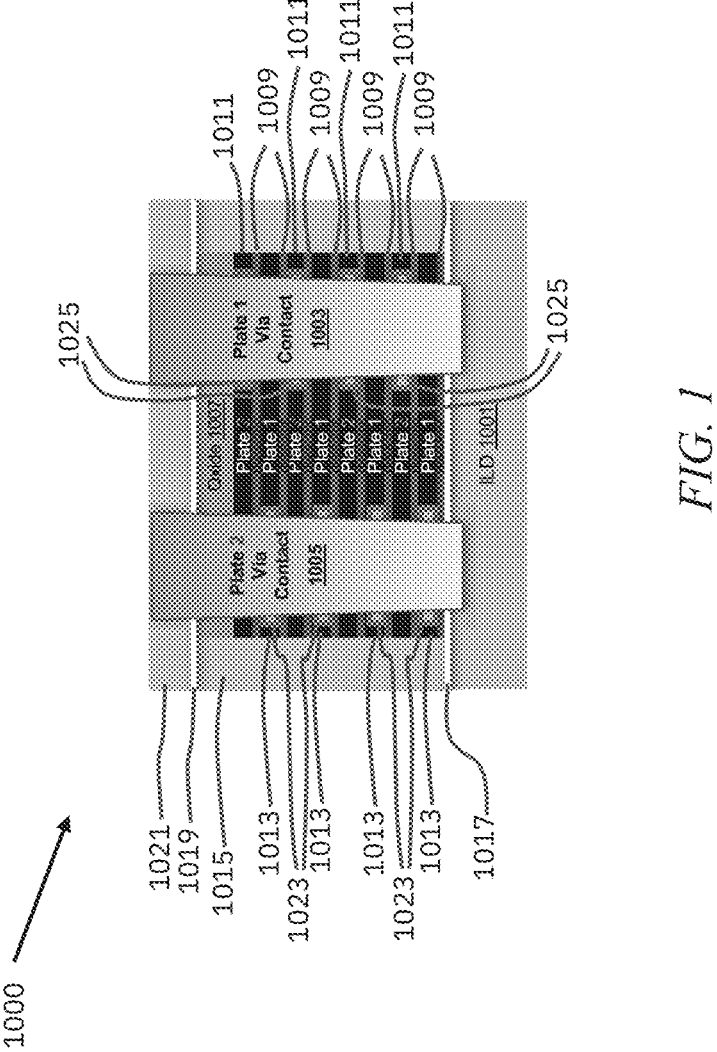
FIG. 1 is a cross-sectional view of a multistack metal-insulator-metal (MIM) structure, according to an aspect of the invention.

FIG. 1 shows an exemplary MIM structure 1000, according to an aspect of the invention. The structure includes a plurality of first plates 1013 electrically connected to a first plate via contact 1003, and a plurality of second plates 1011 electrically connected to a second plate via contact 1005. The first and second plates 1013, 1011 are separated by a plurality of dielectric layers 1009. The plates can be made from, for example, TiN, TaN, Ta, Ti, W, Al, Co, bi-layers or combinations thereof. Layers 1009 can employ, for example, high-k dielectrics which can be, for example, $HfO_2$, $AlO_2$, $ZrO_2$, $Ta2O_5$, $TiO_2$, BaO, and the like. Some embodiments use multi-layer stacks of high-k material, such as $TiN/ZrO_2/$ TiN, for instance. There is greater flexibility for material choices and higher temperature processes in embodiments where no copper back end of line (BEOL) processing is present. The plurality of first plates 1013 are electrically isolated from the second plate via contact 1005 by a plurality of dielectric spacers 1023, and the plurality of second plates 1011 are electrically isolated from the first plate via contact 1003 by a plurality of dielectric spacers 1025. As discussed below, the spacers can include a thin conformal dielectric layer 1033 and a dielectric 1045. Dielectric 1045 can be the same as the ILD (discussed below), but can also be different. Dielectric 1045 may, for example, require different properties than the ILD to fill the gaps and planarize the structure. Dielectric 1045 can, for example, be a flowable chemical vapor deposition (CVD) oxide, high density plasma CVD oxide, material deposited by atomic layer deposition (ALD), or other satisfactory material applied by other satisfactory method(s). In structure 1000, note the inter-layer dielectric (ILD) 1001 and the oxide layer 1007.

Elements 1015, 1021 are additional ILD. Elements 1017, 1019 represent etch stop layers that can be present at various locations in some embodiments, and are convenient for processing. The bottommost high-k layer 1009 present below bottommost first plate 1013 is optional and can function as an etch stop in some cases.

Thus, in FIG. 1, the vias 1003, 1005 make contact to alternating plates and are electrically isolated from the other plates using spacers 1025, 1023, respectively. Thus, the plurality of individual plates labeled "Plate 1" are interconnected, forming together an overall first plate, and the plurality of individual plates labeled "Plate 2" are interconnected, forming together an overall second plate. Exemplary structures according to aspects of the invention thus provide one or more of a capacitive structure with recesses (the lateral recesses formed in FIGS. 11 and 13 (different sizes) and FIGS. 19-25 (same size)) in the MIM plates 1013, 1011, which have alternating lateral recess sizes, which can also be referred to as depths, with dielectric liners; a stacked capacitive structure that has vias 1003, 1005 with electrical connections to every other plate using metal liners and isolation from every other plate using dielectric spacers 1023, 1025. In the embodiment depicted in FIGS. 16-26, metal liners are formed as part of spacer process, as shown in FIG. 24. In the embodiment of FIGS. 2-15, the final via contact 1003, 1005 could have a metal liner, as appropriate. Exemplary structures according to aspects of the invention thus provide one or more of a discrete capacitor with a stacked MIM approach that has recesses in the MIM plates that have alternating depths (best seen, for example, in FIG. 13 discussed below); and/or a discrete capacitor that has vias 1003, 1005 adjacent to alternating layers of metal plugs and dielectric plugs 1023, 1025 (as seen in the embodiment depicted in FIGS. 16-26). One pertinent aspect of one or more embodiments is the use of spacers 1023, 1025 (see FIG. 1), or 1049 (see FIG. 26) to enable a stacked MIM capacitor structure with many plates, which does not require lithographic patterning at each step.

Figures 2, 3, 4, 5, 6, 7:
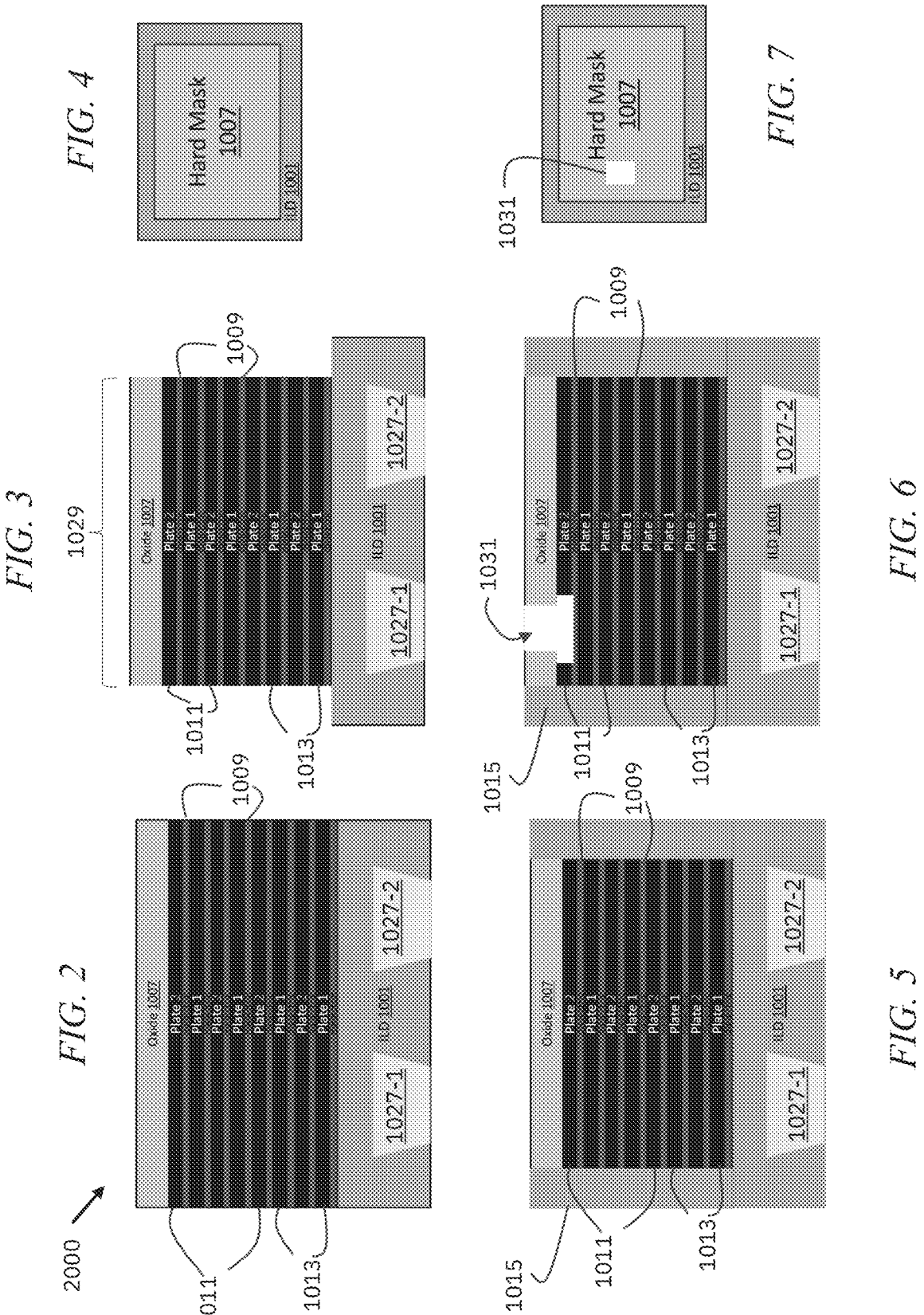
FIGS. 2-15 show successive stages in a method for fabricating a multi-stack metal-insulator-metal (MIM) structure, according to an aspect of the invention.

Referring now to FIG. 2, consider an exemplary method for manufacturing an exemplary capacitive structure, according to an aspect of the invention. The exemplary technique includes both shallow and deep recess (see, e.g., FIG. 13), and a single liner material 1033 (see, e.g., FIG. 8). As shown in FIG. 2, start with a precursor structure 2000. Structure 2000 includes an ILD layer 1001 with first and second plates 1013, 1011 separated by a plurality of dielectric layers 1009, as discussed above. An optional metal layer with metal lines 1027-1, 1027-2 can be provided within the ILD layer 1001. Oxide layer 1007 is outward of the uppermost second plate 1011. Oxide layer 1007 is one option for use as a hard mask; the hard mask can include one or more layers. In a non-limiting example, the plates are on the order of 35 nm thick, and the dielectric layers are a high-k dielectric on the order of 5 nm thick, with exemplary materials set forth elsewhere herein.

Refer now to FIG. 3 and the corresponding top view in FIG. 4, which depicts patterning a full stack 1029 of MIM plates. Note that the oxide layer 1007 forms a hard mask. The skilled artisan will be familiar with lithographic and etching techniques suitable for patterning the full stack 1029.

Moving on to FIG. 5, deposit additional ILD 1015 and planarize. Optionally, there can be a thin liner employed before depositing the ILD. The skilled artisan will be familiar with suitable techniques for depositing ILD and with suitable planarization techniques, such as chemical-mechanical polishing (CMP). Referring to FIG. 6 with a corresponding top view in FIG. 7, pattern a contact opening 1031 through the oxide 1007, directionally etch the uppermost Plate 2 1011, and make a small recess under the oxide 1007. In one or more embodiments, lithography is used to pattern the oxide 1007. The skilled artisan will be generally familiar with patterning, lithography, photoresist, and so on. In some instances, the photoresist is left on the surface until the step depicted in FIGS. 6 and 7 is complete, but can optionally be removed at any time. For example, the photoresist can theoretically be maintained until after FIG. 13 or even after FIG. 14 if the temperature of the liners and ILD are kept sufficiently low. There are some methods, such as ALD, and some forms of CVD, that can achieve this. I'm not saying it is the best approach, but the main One pertinent reason for keeping more photoresist is to reduce the thickness needed for the hard mask. Thus, in one or more embodiments, (i) use lithography and etching to form a hole 1031 in the oxide 1007, then (ii) directionally etch down into the uppermost Plate 2 with another etchant, and then (iii) etch laterally (undercut) in the uppermost Plate 2 with still another etchant to form the inverted T shape (alternatively, use a similar etchant for the lateral etching (iii) as was used downward into the uppermost Plate 2 in (ii), but with different etch parameters (pressure, power, etc.)). Steps (ii) and (iii) could alternatively be combined, although that may slightly change the undercut profile.

Figures 8, 9, 10, 11, 12:
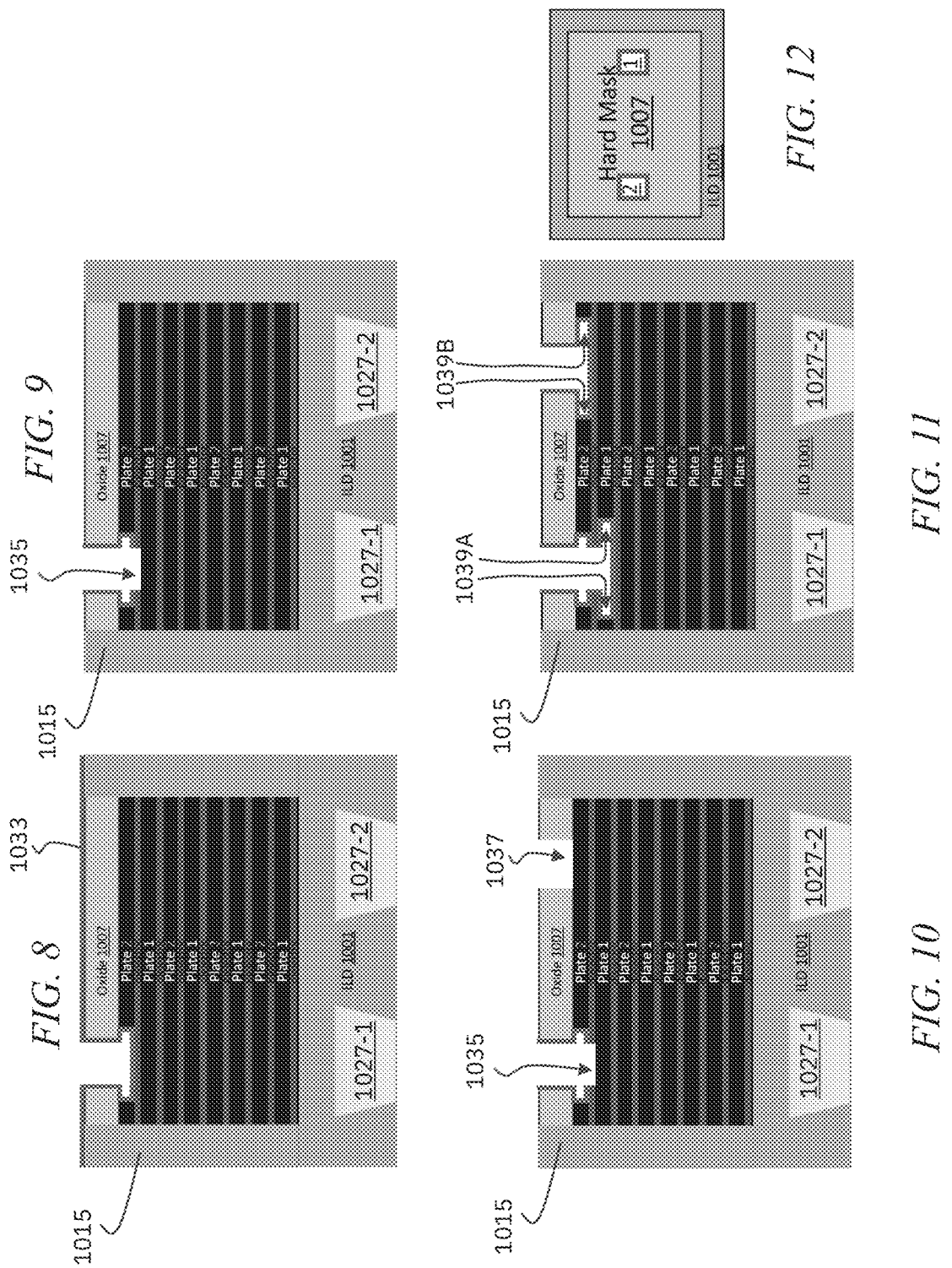
Figure 13:
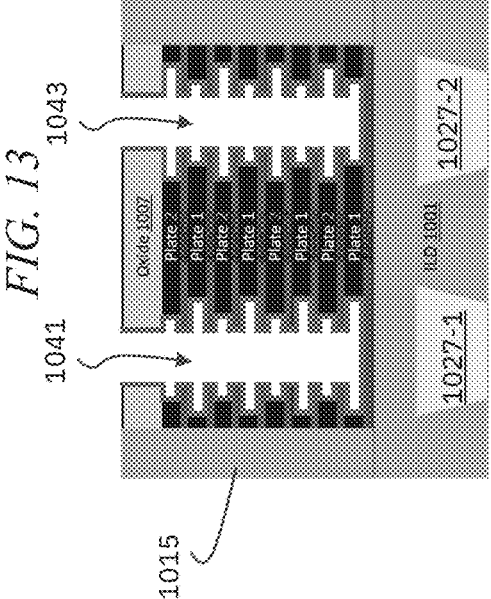

Moving now to FIG. 8, deposit a thin conformal dielectric layer 1033. Numbering for the plates and dielectric layers 1013, 1011, 1009 is omitted from FIGS. 8-15 to avoid clutter. In FIG. 9, etch the uppermost high-k dielectric layer 1009 as seen at 1035. This also removes the conformal layer 1033 on the upper surface; the conformal layer only remains on vertical surfaces or surfaces protected by the undercut. In FIG. 10, pattern a contact opening 1037 for plate 1. In FIG. 11, with top view in FIG. 12, etch into the uppermost instance of Plate 2 through the opening 1037, and etch into the uppermost instance of Plate 1 underneath region 1035. This etching is carried out to provide a larger metal recess (in the lateral direction) than in FIG. 6, as seen at 1039A, 1039B. Openings corresponding to first plate via contact 1003 and second plate via contact 1005 are numbered 2, 1 in FIG. 12. Referring to FIG. 13, continue to carry out the operations of FIGS. 6-12; i.e., a cyclical process of etching the plates with small and large recesses and liner depositions, until all the plates have been etched, as shown, resulting in cavities 1041, 1043. In one or more embodiments, deposit more of the thin conformal dielectric layer 1033 on the side walls of the recesses. In some cases, there may be decreasing thickness of liner, with the upper plates having thicker liner due to multiple such depositions. Thus, the liner may have one or more layers, and may not be of uniform thickness at every layer. The liner may even be pinched off at the upper layers (if the liner is formed sequentially as each layer is etched, it is quite likely it will get pinched off in the upper layers through multiple depositions). Alternatively, the lines can be stripped after all the undercuts are complete, and a new liner can be re-deposited everywhere so that it has relatively uniform thickness for all undercuts. Note that, optionally, an etch stop layer such as 1017 can be provided under the lowest instance of Plate 1 to prevent additional etching on the Plate 2 via contact side due to staggered etching of the plates (with the left side starting first in the non-limiting example depicted in the figures). Alternatively, the bottommost 1009 could function as an etch stop and could be formed of a different material than the other instances of 1009.

Figure 14:
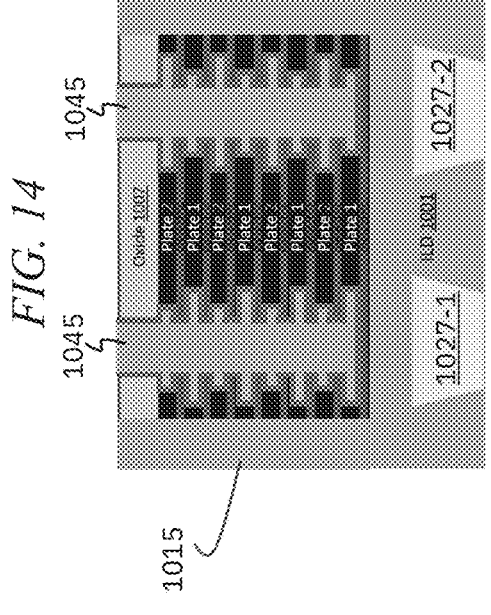
Figure 15:
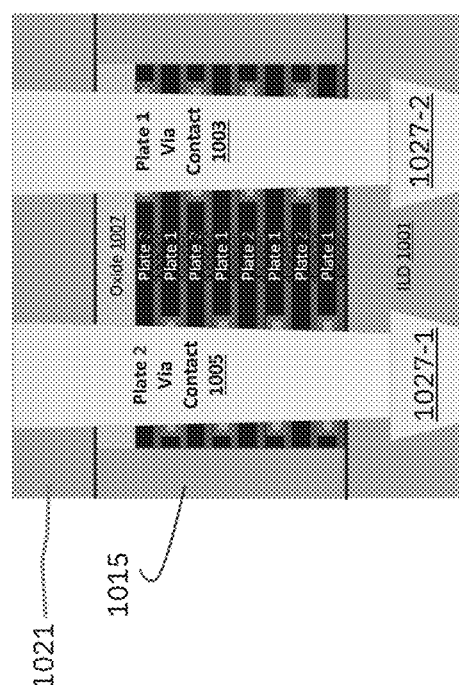

Moving to FIG. 14, fill the cavities 1041, 1043 resulting from the process of FIG. 13 with dielectric 1045 and planarize. Then, as per FIG. 15, etch cavities for the vias and deposit metal to obtain the via contacts 1003, 1005. Note the additional dielectric 1021. As noted, optionally, a metal layer with metal lines 1027-1, 1027-2 is provided below the stacked MIM, depending on the implementation. In FIG. 14, the dielectric 1045 can be the same as, or different than, the ILD; for example, it can be a flowable CVD oxide or the like. In FIG. 15, the additional dielectric 1021 can be the same as the ILD or can be any other suitable dielectric.

Figures 16, 17, 18, 19, 20, 21:
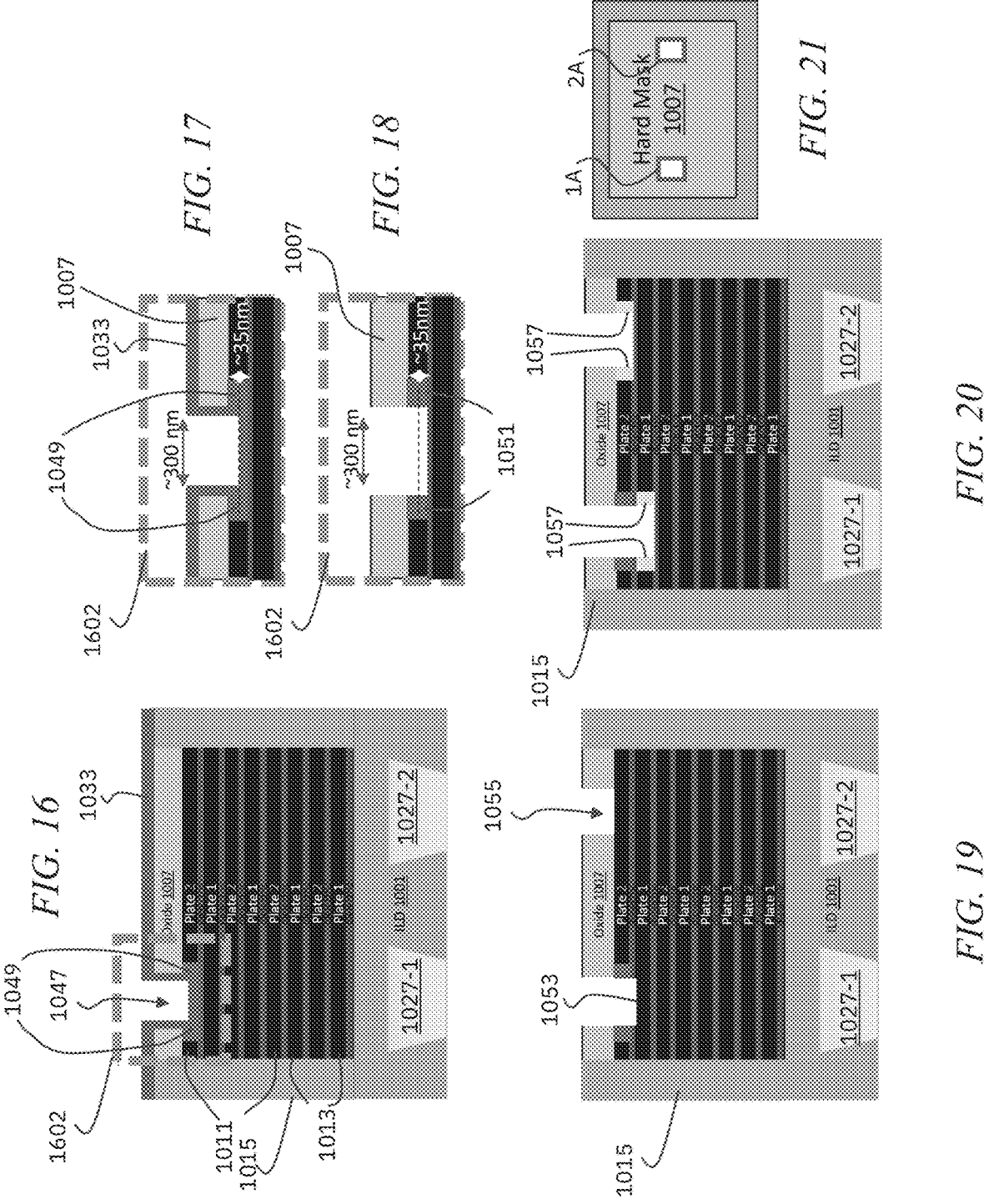
FIGS. 16-25 show successive stages in another method for fabricating a multi-stack metal-insulator-metal (MIM) structure, according to an aspect of the invention.

Referring now to FIG. 16, consider an alternative method for manufacturing another exemplary capacitive structure, according to another aspect of the invention. This alternate embodiment employs a single depth recess with two liners. The steps of FIGS. 2-8 can be repeated; then, as seen in FIGS. 16 and 17, deposit a thin SiN film 1049 to plug the metal recess. The thin SiN film 1049 can be, for example, about 20 nm; generally, the thickness is selected as needed to plug depending on thickness of plate—it should typically be approximately half the thickness of the plate to plug it. Note the enlarged detail of region 1602 shown in FIG. 17. The plates and dielectric layers in FIGS. 16-26 can be similar to the plates and dielectric layers 1013, 1011, 1009 in the first embodiments; numbering of same is omitted from FIGS. 16-26 to avoid clutter. The opening 1047 can have a width of about 300 nm as seen in FIG. 17. The uppermost Plate 2 instance can have a thickness of about 35 nm. In FIG. 18, etch back the SiN spacer, leaving plugged metal recesses 1051.

Turning now to FIG. 19, etch the uppermost dielectric layer on the left side, as seen at 1053, and pattern a contact opening on the right side, as seen at 1055. Then, referring to FIG. 20 with top view in FIG. 21, etch the uppermost Plate 1 on the left and the uppermost Plate 2 on the right. Note the oxide plugs 1057. Openings of FIG. 20 corresponding to first plate via contact 1003A and second plate via contact 1005A (see FIG. 24) are numbered 1A, 2A in FIG. 21.

Figure 22:
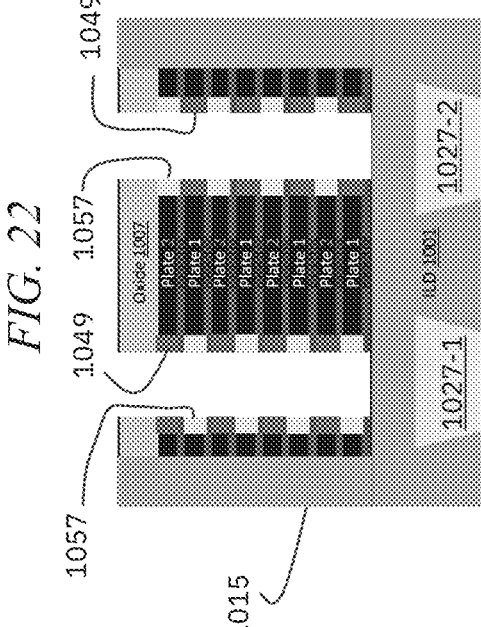

FIG. 22 shows a resulting structure after repeating the steps of FIGS. 16-21 until each of the first plates is separated from the opening that will receive the first plate via contact 1003A by an oxide plug 1057 and from the opening that will receive the second plate via contact 1005A by SiN 1049, and until each of the second plates is separated from the opening that will receive the second plate via contact 1005A by SiN 1049 and from the opening that will receive the first plate via contact 1003A by an oxide plug 1057. Note that the bottom of the MIM stack can be resting on a via (see discussion of FIG. 25), or the via can be etched after the cyclical plate etch (as seen in FIG. 23); the regions where the additional etching down to metal 1027-1, 1027-2 is carried out are designated as 1059-1, 1059-2.

In the alternative approach of FIG. 25, the MIM stack can be resting on vias 1061-1, 1061-2 below, which provide the connection to the metal 1027-1, 1027-2.

Figure 23:
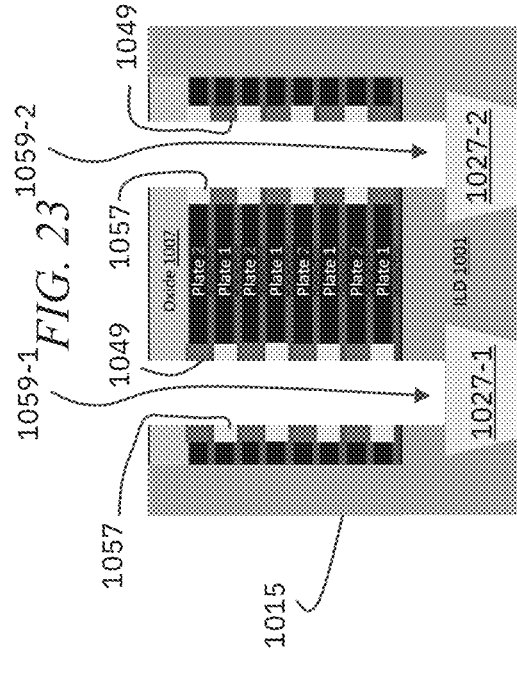
Figure 24:
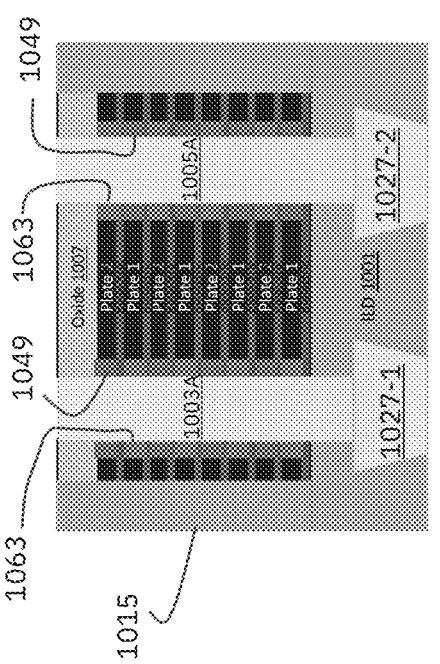
Figure 25:
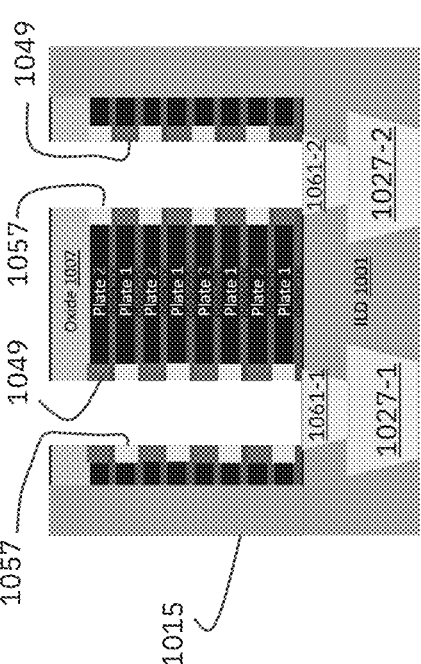

Whether the approach of FIGS. 22 and 23 or the approach of FIG. 25 is employed, in FIG. 24, selectively remove the oxide plugs 1057 and fill the resulting voids with metal liner 1063. Then, carry out suitable etching, such as reactive ion etching (RIE) on the metal liner, and metallize the voids (e.g., with copper), and planarize, to obtain the first plate via contact 1003A and second plate via contact 1005A. In one or more embodiments, the conductive liner is a different material than the contacts 1003A/1005A; for example, the latter is conductive metal fill, such as Ru, W, Co, or Cu, while the former includes Ni, Ti, NiPt, etc. In some cases, the plates are of a different material than the conductive liner and the contacts. It is worth noting that etching back the metal liner is one possibility, but some embodiments make the structure without etching back the metal liner, thereby going straight from the metal liner process to via fill. In one or more embodiments, a continuous liner on the edge of the via penetrates into the spacer regions in the plates. Alternatively, if the liner is etched back after forming the conductive inner spacer, when the via is metallized, it can have one or more conductive liners as part of the via process. The skilled artisan will be familiar with standard techniques for the metallizing of vias, including the use of liners prior to metallization. In another aspect, the contacts can be any of the metals listed herein and the conductive liner can be a different one of any of the metals listed herein.

Figure 26:
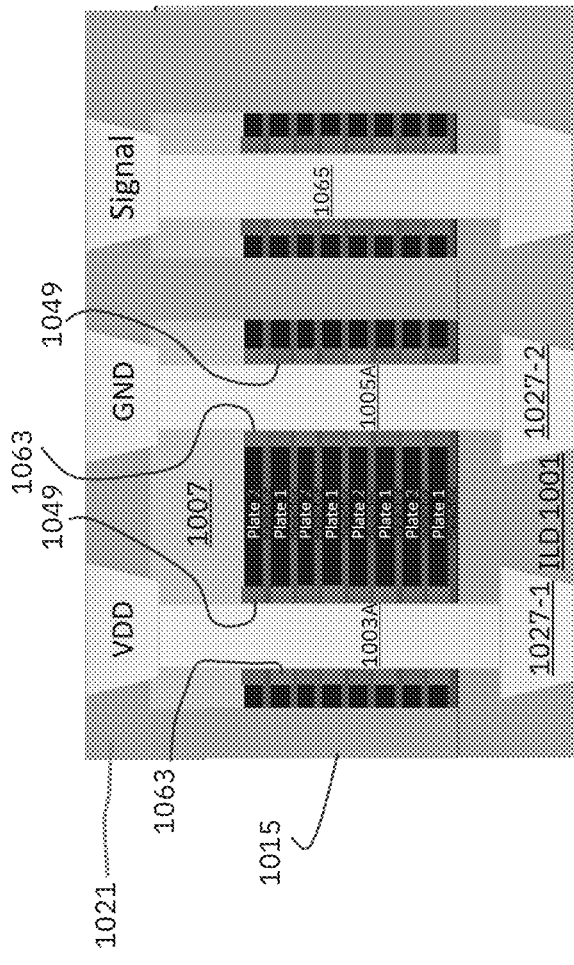
FIG. 26 is a cross-sectional view of another multistack metal-insulator-metal (MIM) structure, according to an aspect of the invention.

Referring now to FIG. 26, note that Plate 1 can be connected, for example, to a power supply such as VDD, while Plate 2 can be connected, for example, to ground GND. A signal via 1065 can, for example, have dummy plates and be etched simultaneously with the power vias, or can be patterned separately with no plates, meaning that the signal via may not go through any plates, but rather it can be a via etched through the ILD adjacent to the stack of plates. Note that in one or more embodiments, a thicker hardmask for the MIM plate etching serves as an upper portion of the via; furthermore in this regard, element 1007 in FIG. 26 can be the same as in the other figures, but optionally, at the end, there may be thick hardmask, thin hardmask, or no hardmask remaining above the stack. If there is hardmask remaining, it may become part of the via patterning. In some instances, the metal lines (VDD, GND, and Signal) can land directly on the vias 1003A, 1005A, 1065. A dual damascene line/via is also possible, with sacrificial fill of the vias after the MIM plate stack etch; then, dual damascene patterning can be carried out, the sacrificial material pulled out, and fill can take place. This aspect refers to a dual damascene line/via case, where a planarizing dummy fill is used to enable dual damascene patterning/processing. Another embodiment can include conducting plugs and dielectric plugs during the MIM plate stack etch. In this aspect, element 1057 is actually a conducting/metal plug (from the outset) that is formed during the various recess processes of the plates, instead of pulling out a dielectric 1057 and replacing it with conducting liner.

Thus, it will be appreciated that one or more embodiments include depositing an alternating stack of high-k dielectric and metal plates; etching a first hole down to a first plate and recessing (FIG. 6), then depositing a dielectric liner 1033; etching a second hole 1037 down to the first plate and recessing a larger (wider) recess 1039B, while also etching a larger (wider) recess 1039A in a second plate with the first hole; and repeating the process of etching shallow/narrow and deep/wide on alternate plates; filling the entire structure with dielectric (FIG. 14); and etching vias (FIG. 15), whereby one via connects to all protruding plates in one hole and another via connects to all protruding plates in another hole.

One or more embodiments advantageously provide a capacitor structure that can achieve extremely high capacitor density using large quantities of stacked MIM structures in a very thin form factor (for example, much thinner than Si caps based on pillar or trench structures). For example, if discussing just the capacitor structure, it can be just a couple of hundred nm thick if there are only three plates. However, one or more embodiments are attractive for embodiments with more than three plates, which cannot be achieved using prior art patterning techniques. For embodiments that are more than 3 plates, they will typically be at least a few hundred nm thick, and likely will not exceed a couple microns of thickness with many plates. Pillar or deep trench caps may start at depths of a couple of microns and can be tens of microns or more (depending on feature sizes). These structures typically need to be on a substrate with some thickness, depending on the application. The substrate could be tens of microns, for example, depending on handling requirements.

Advantageously, one or more embodiments do not require a silicon substrate, in clear contrast to silicon-based trenches or pillars, which rely on the unique etching properties of silicon to enable high aspect ratio features. The plate and high-k materials can be deposited, for example, on alternate substrates, such as glass. Note, however, that silicon is relatively cheap, and it may be desirable in some embodiments due to thermal performance or coefficient of thermal expansion (CTE) matching, and the like.

One or more embodiments are well-suited for heterogenous integration (HI) applications due to the potential for extremely high capacitor densities and the industry need for extremely high density capacitors with compact form factors. Currently, some prior-art commercial products enable <100 nF/mm$^2$ in the back end of line (BEOL) with MIM caps. Prior-art products based on deep trench technology have achieved approximately a few hundred nF/mm$^2$, and may potentially achieve up to a couple of μF/mm$^2$. Silicon pillars may achieve around 1 μF/mm$^2$ or more. Extremely high capacitor density refers to values above 1 μF/mm$^2$. Values of even a few hundred nF/mm$^2$ can be considered as very high. It is believed that all current solutions are based on silicon caps. Compact implementations are desirable to enable embedding or joining in various locations and the have appropriate mechanical and thermal properties.

In another aspect, a capacitive structure includes recesses in MIM plates that have alternating depths/widths with dielectric liners, as seen in the embodiment of FIGS. 2-15. Furthermore, a stacked capacitive structure is provided, which has vias with electrical connections to every other plate using metal liners and isolation from every other plate using dielectric spacers, as seen in the embodiment of FIGS. 16-26. Even further, a discrete capacitor is provided with a stacked MIM capacitor that has recesses in MIM plates that have alternating depths/widths, as seen in the embodiment of FIGS. 2-15. Yet further, a discrete capacitor has vias adjacent to alternating layers of metal plugs and dielectric plugs, as seen in the embodiment of FIGS. 16-26.

The aforementioned capacitor structure can, for example, be part of a silicon or organic interposer; generally, can be employed anywhere in modern integrated circuit and packaging technologies. For example, if a MIM cap according to aspects of the invention is not incorporated in an active chip, then it can be provided with its own final termination, depending on whether it will be joined to a package, chip, etc. So, for example, it may require a bond pad, solder ball, or the like, as would be apparent to the skilled artisan given the teachings herein.

In yet another aspect, a method and/or structure are provided for forming a multi-stacked MIM capacitor (e.g., 1000) which can be integrated in the back end of line (BEOL) between metal layers or on the backside of a wafer. Furthermore, a method and/or structure are provided for forming recesses in MIM plates that have alternating depths/widths with dielectric liners; a method and/or structure are provided for forming recesses of different depths/widths in a given MIM plate; a method and/or structure are provided for forming recesses in MIM plates with alternating dielectrics, as seen in the embodiment of FIGS. 16-26, or alternating conducting and insulating liners; and/or a method and/or structure are provided for forming contacts to select MIM plates.

One or more embodiments allow for a multi-plate capacitor structure with limited masks, as opposed to prior art techniques that require additional masks for each plate and/or removal of wiring tracks.

Semiconductor device manufacturing and related fields include various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photoresist material may first be applied on top of a substrate, and then be exposed selectively according to a pre-determined device pattern or patterns. Portions of the photo-resist that are exposed to light or other ionizing radiation (e.g., ultra-violet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching." For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary multi-stack metal-insulator-metal (MIM) structure includes a plurality of conductive plates including a first group 1013 comprising odd-numbered ones of the plates and a second group 1011 comprising even-numbered ones of the plates. All of the conductive plates are made of an identical material (they cannot be selectively etched with respect to each other). The consecutive integers run from the bottom to the top starting at 1 for the lowest plate. Also included are a plurality of insulators 1009 between the plurality of conductive plates; a first plate via contact 1003, 1003A; and a second plate via contact 1005, 1005A. The first plate via contact 1003, 1003A extends vertically through the plurality of conductive plates and the plurality of insulators, and is electrically coupled to the first group of conductive plates and electrically isolated from the second group of conductive plates. The second plate via contact 1005, 1005A extends vertically through the plurality of conductive plates and the plurality of insulators, and is electrically coupled to the second group of conductive plates and electrically isolated from the first group of conductive plates.

One or more embodiments further include a first and second pluralities of dielectric spacers (e.g., 1023, 1025 formed by 1033, 1045 or 1049). The first group of conductive plates 1013 are electrically isolated from the second plate via contact 1005 by the first plurality of dielectric spacers 1023, and wherein the second group of conductive plates 1011 are electrically isolated from the first plate via contact 1003 by the second plurality of dielectric spacers 1025 (in the embodiment of FIGS. 16-26, both pluralities of dielectric spacers are numbered 1049).

Some instances further include insulating material located inwardly of an innermost one of the plurality of insulators between the plurality of conductive plates (ILD 1001), on left and right sides of the plurality of conductive plates and the plurality of insulators (ILD 1015), and outward of an outermost one of the plurality of conductive plates (ILD 1021).

Some such instances further include an oxide layer 1007 outward of the outermost one of the plurality of conductive plates; the insulating material is outward of the oxide layer.

In some such instances, the first and second plate via contacts extend upward to an outer surface of the insulating material outward of the oxide layer and partially downward into insulating material located inwardly of an innermost one of the plurality of insulators.

One or more embodiments further include metal lines located in the insulating material located inwardly of an innermost one of the plurality of insulators, in contact with the first and second plate via contacts.

In some cases, the first and second pluralities of dielectric spacers include a thin conformal dielectric layer 1033 surrounding a dielectric 1045.

Referring, for example, to FIG. 24, some embodiments further include first and second pluralities of metal liners 1063. The first group of conductive plates 1013 are electrically connected to the first plate via contact 1005 by the first plurality of metal liners, and the second group of conductive plates 1011 are electrically connected to the second plate via contact 1003 by the second plurality of metal liners.

Referring, for example, to FIG. 25, in some cases, the first and second plate via contacts extend upward to an outer surface of the insulating material outward of the oxide layer and downward to an inmost surface of an innermost one of the plurality of insulators. In this aspect, a multi-stack metal-insulator-metal (MIM) structure further includes vias 1061 inward of, and electrically contacting, the first and second plate via contacts; and first and second and metal lines 1027-1, 1027-2 located in the insulating material inwardly of, and electrically contacting, the vias 1061.

In another aspect, referring to FIG. 24, a multi-stack metal-insulator-metal (MIM) structure includes a plurality of conductive plates including a first group 1013 comprising odd-numbered ones of the plates and a second group 1011 comprising even-numbered ones of the plates. See above regarding plates being numbered in consecutive integers from bottom to top starting at 1 for the lowest. Also included are a plurality of insulators 1009 between the plurality of conductive plates; a first plate via contact 1003A and a second plate via contact 1005A. The first plate via contact 1003A extends vertically through the plurality of conductive plates and the plurality of insulators. The first plate via contact is electrically coupled to the first group of conductive plates and electrically isolated from the second group of conductive plates. The second plate via contact 1005A extends vertically through the plurality of conductive plates and the plurality of insulators. The second plate via contact is electrically coupled to the second group of conductive plates and electrically isolated from the first group of conductive plates.

First and second pluralities of dielectric spacers 1049 are provided; as noted, in the embodiment of FIGS. 16-26, both pluralities of dielectric spacers are numbered 1049. The first group of conductive plates 1013 are electrically isolated from the second plate via contact 1005A by the first plurality of dielectric spacers 1049, and the second group of conductive plates 1011 are electrically isolated from the first plate via contact 1003A by the second plurality of dielectric spacers 1049. First and second pluralities of metal liners 1063 are provided; in the embodiment of FIGS. 16-26, both pluralities of metal liners are numbered 1063. The first group of conductive plates 1013 are electrically connected to the first plate via contact 1005A by the first plurality of metal liners, and the second group of conductive plates 1011 are electrically connected to the second plate via contact 1003A by the second plurality of metal liners.

One or more embodiments further include insulating material (ILD 1001) located inwardly of an innermost one of the plurality of insulators between the plurality of conductive plates, on left and right sides of the plurality of conductive plates and the plurality of insulators (ILD 1015), and outward of an outermost one of the plurality of conductive plates (ILD 1021).

One or more embodiments further include an oxide layer 1007 outward of the outermost one of the plurality of conductive plates; the insulating material 1021 is outward of the oxide layer.

In one or more embodiments, the first and second plate via contacts extend upward at least into the oxide layer and partially downward into insulating material located inwardly of an innermost one of the plurality of insulators.

One or more embodiments further include metal lines 1027-1, 1027-2 located in the insulating material located inwardly of an innermost one of the plurality of insulators, in contact with the first and second plate via contacts.

Referring, for example, to FIG. 25, in some instances, the first and second plate via contacts extend upward at least into the oxide layer and downward to an inmost surface of an innermost one of the plurality of insulators, and the multi-stack metal-insulator-metal (MIM) structure further includes vias 1061-1, 1061-2 inward of, and electrically contacting, the first and second plate via contacts; and first and second and metal lines 1027-1, 1027-2 located in the insulating material inwardly of, and electrically contacting, the vias 1061.

In accordance with another aspect, an exemplary method for fabricating a multi-stack metal-insulator-metal (MIM) structure includes obtaining a precursor structure 2000 including a plurality of conductive plates, including a first group 1013 comprising odd-numbered ones of the plates and a second group 1011 comprising even-numbered ones of the plates. The precursor structure also includes a plurality of insulators 1009 between the plurality of conductive plates; and an oxide hard mask 1007 outward of an outermost one of the plurality of conductive plates. Further steps include patterning and etching a contact opening 1031 for a second plate via contact; forming a lateral recess of a first width (T-shaped lower part of 1031) into the outermost one of the plurality of conductive plates; depositing a conformal dielectric layer 1033 on an outer surface of the precursor structure, sides of the contact opening, and surfaces of the lateral recess; and etching the conformal dielectric layer on exposed horizontal surfaces thereof, as seen in FIG. 9. Still further steps include patterning and etching a contact opening 1037 for a first plate via contact; and forming a lateral recess of a first width into the outermost one of the plurality of conductive plates through the contact opening for the first plate via contact and the next outermost one of the plurality of conductive plates through the contact opening for the second plate via contact, the second width being larger than the first width (FIG. 11 wider openings 1039A).

At least the steps of forming the lateral recess of the first width and the lateral recess of the second width are repeated for successively inward pairs of the plurality of conductive plates, until (FIG. 13) the second group of conductive plates have lateral recesses of the first width adjacent the contact opening for the second plate via contact and lateral recesses of the second width adjacent the contact opening for the first plate via contact, and the first group of conductive plates have lateral recesses of the first width adjacent the contact opening for the first plate via contact and lateral recesses of the second width adjacent the contact opening for the second plate via contact.

In one or more embodiments, the repeated steps are advantageously carried out without lithographic patterning (after that shown in FIG. 12). Further, the skilled artisan will appreciate that after FIG. 11, double narrow recesses are formed at left and right as part of the repeated process; also, in a final step, the last narrow recess on the right is formed.

One or more embodiments further include filling the contact opening for the first plate via contact, the contact opening for the second plate via contact, the lateral recesses of the first width, and the lateral recesses of the second width, with dielectric fill 1045; further opening the contact openings for the first and second plate via contacts to a width that is greater than the first width and less than the second width (carried out between FIG. 14 and FIG. 15); and filling the further opened contact openings for the first and second plate via contacts with conductive material to form the first and second plate via contacts 1003, 1005 such that the first plate via contact is electrically coupled to the first group of conductive plates and electrically isolated from the second group of conductive plates and the second plate via contact is electrically coupled to the second group of conductive plates and electrically isolated from the first group of conductive plates (see FIG. 15).

In accordance with still another aspect, another exemplary method for fabricating a multi-stack metal-insulator-metal (MIM) structure includes obtaining a precursor structure 2000 including a plurality of conductive plates, including a first group 1013 comprising odd-numbered ones of the plates and a second group 1011 comprising even-numbered ones of the plates; a plurality of insulators 1009 between the plurality of conductive plates; and an oxide hard mask 1007 outward of an outermost one of the plurality of conductive plates. Further steps include patterning and etching a contact opening 1047 for a first plate via contact; forming a lateral recess of a given width into the outermost one of the plurality of conductive plates through the first plate via contact; and depositing a conformal dielectric layer on an outer surface of the precursor structure, sides of the contact opening, and filling the lateral recess (see FIG. 16). Still further steps include etching the conformal dielectric layer on exposed horizontal surfaces thereof, leaving the plugged recess as per FIG. 19; patterning and etching a contact opening 1055 for a second plate via contact; and forming a lateral recess of the given width into the outermost one of the plurality of conductive plates through the contact opening for the second plate via contact and the next outermost one of the plurality of conductive plates through the contact opening for the first plate via contact (the latter aspect carried out between FIGS. 19 and 20).

A further step includes filling the lateral recess in the outermost one of the plurality of conductive plates that was formed through the contact opening for the second plate via contact and the lateral recess in the next outermost one of the plurality of conductive plates that was formed through the contact opening for the first plate via contact with oxide plugs 1057, as in FIG. 20.

The methos further includes repeating, for successively inward pairs of the plurality of conductive plates, at least the steps of forming the lateral recess of the given width through the first plate via contact, depositing the conformal dielectric layer, forming the lateral recess of the given width into the outermost one of the plurality of conductive plates through the contact opening for the second plate via contact and the next outermost one of the plurality of conductive plates through the contact opening for the first plate via contact, and filling the lateral recess in the outermost one of the plurality of conductive plates that was formed through the contact opening for the second plate via contact and the lateral recess in the next outermost one of the plurality of conductive plates that was formed through the contact opening for the first plate via contact with oxide plugs, until the second group of conductive plates have lateral recesses filled with the oxide plugs adjacent the contact opening for the second plate via contact and lateral recesses filled with the conformal dielectric adjacent the contact opening for the first plate via contact, and the first group of conductive plates have lateral recesses filled with the oxide plugs adjacent the contact opening for the first plate via contact and lateral recesses filled with the conformal dielectric adjacent the contact opening for the second plate via contact. See FIG. 22 for the end result of this repeated process.

In one or more embodiments, the repeated steps are advantageously carried out without lithographic patterning (after that shown in FIG. 21). Further, the skilled artisan will appreciate that after FIG. 20, the next double recesses 1057 that are formed at left and right are filled with SiN 1049 as part of the repeated process; also, in a final step, the last recess on the right is formed and filled.

Further steps include removing the oxide plugs to form gaps (between FIG. 23 and FIG. 24), and filling the gaps with contact metal 1063.

One or more embodiments further include filling the contact openings for the first and second plate via contacts with conductive material to form the first and second plate via contacts such that the first plate via contact is electrically coupled to the first group of conductive plates (with the contact metal 1063 filled in the gaps) and electrically isolated from the second group of conductive plates (with the SiN 1049) and the second plate via contact is electrically coupled to the second group of conductive plates (with the contact metal 1063 filled in the gaps) and electrically isolated from the first group of conductive plates (with the SiN 1049), as seen in FIG. 25.

In another aspect, an exemplary multi-stack metal-insulator-metal (MIM) structure includes a plurality of conductive plates including a first group 1013 comprising odd-numbered ones of the plates and a second group 1011 comprising even-numbered ones of the plates. In this aspect, the conductive plates can be made of an identical material (such that they cannot be selectively etched with respect to each other), or of different materials. The consecutive integers run from the bottom to the top starting at 1 for the lowest plate. Also included are a plurality of insulators 1009 between the plurality of conductive plates; a first plate via contact 1003, 1003A; and a second plate via contact 1005, 1005A. The first plate via contact 1003, 1003A extends vertically through the plurality of conductive plates and the plurality of insulators, and is electrically coupled to the first group of conductive plates and electrically isolated from the second group of conductive plates. The second plate via contact 1005, 1005A extends vertically through the plurality of conductive plates and the plurality of insulators, and is electrically coupled to the second group of conductive plates and electrically isolated from the first group of conductive plates. Also included are first and second pluralities of dielectric spacers (e.g., 1023, 1025 formed by thin conformal dielectric layer 1033 and a dielectric 1045 (flowable fill different than the thin liner)). The first group of conductive plates 1013 are electrically isolated from the second plate via contact 1005 by the first plurality of dielectric spacers 1023, and wherein the second group of conductive plates 1011 are electrically isolated from the first plate via contact 1003 by the second plurality of dielectric spacers 1025 (in the embodiment of FIGS. 16-26, both pluralities of dielectric spacers are numbered 1049).

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A multi-stack metal-insulator-metal (MIM) structure comprising:
    a plurality of conductive plates including a first group comprising odd-numbered ones of the plates and a second group comprising even-numbered ones of the plates, all of the conductive plates being of an identical material;
    a plurality of insulators between the plurality of conductive plates;
    a first plate via contact extending vertically through the plurality of conductive plates and the plurality of insulators, each conductive plate and each insulator located on left and right sides of the first plate via contact, the first plate via contact being electrically coupled to the first group of conductive plates and electrically isolated from the second group of conductive plates; and
    a second plate via contact extending vertically through the plurality of conductive plates and the plurality of insulators, each conductive plate and each insulator located on left and right sides of the second plate via contact, the second plate via contact being electrically coupled to the second group of conductive plates and electrically isolated from the first group of conductive plates.

2. The multi-stack metal-insulator-metal (MIM) structure of claim 1, further comprising first and second pluralities of dielectric spacers, wherein the first group of conductive plates are electrically isolated from the second plate via contact by the first plurality of dielectric spacers, and wherein the second group of conductive plates are electrically isolated from the first plate via contact by the second plurality of dielectric spacers.

3. The multi-stack metal-insulator-metal (MIM) structure of claim 2, further comprising:
    an innermost insulator located below a bottommost conductive plate of the plurality of conductive plates; and
    insulating material located inwardly of the innermost insulator, on left and right sides of the plurality of conductive plates and the plurality of insulators, and outward of an outermost one of the plurality of conductive plates.

4. The multi-stack metal-insulator-metal (MIM) structure of claim 3, further comprising an oxide layer outward of the outermost one of the plurality of conductive plates, the insulating material being outward of the oxide layer.

5. The multi-stack metal-insulator-metal (MIM) structure of claim 4, wherein the first and second plate via contacts extend upward to an outer surface of the insulating material outward of the oxide layer and partially downward into insulating material located inwardly of the innermost insulator.

6. The multi-stack metal-insulator-metal (MIM) structure of claim 4, wherein the first and second plate via contacts extend upward to an outer surface of the insulating material outward of the oxide layer and downward to an inmost surface of the innermost insulator, further comprising:
    vias inward of, and electrically contacting, the first and second plate via contacts; and
    first and second metal lines located in the insulating material inwardly of, and electrically contacting, the vias.

7. The multi-stack metal-insulator-metal (MIM) structure of claim 3, further comprising metal lines located in the insulating material located inwardly of the innermost insulator, in contact with the first and second plate via contacts.

8. The multi-stack metal-insulator-metal (MIM) structure of claim 2, wherein the first and second pluralities of dielectric spacers include a thin conformal dielectric layer surrounding a dielectric.

9. The multi-stack metal-insulator-metal (MIM) structure of claim 2, further comprising first and second pluralities of metal liners, wherein the first group of conductive plates are electrically connected to the first plate via contact by the first plurality of metal liners, and wherein the second group of conductive plates are electrically connected to the second plate via contact by the second plurality of metal liners.

10. The multi-stack metal-insulator-metal (MIM) structure of claim 1, further comprising:
    an innermost insulator located below a bottommost conductive plate of the plurality of conductive plates, the innermost insulator being of a same material as the plurality of insulators between the plurality of conductive plates;
    insulating material located inwardly of the innermost insulator; and
    an etch stop layer sandwiched between the innermost insulator and the insulating material.

11. A multi-stack metal-insulator-metal (MIM) structure comprising:
    a plurality of conductive plates including a first group comprising odd-numbered ones of the plates and a second group comprising even-numbered ones of the plates;
    a plurality of insulators between the plurality of conductive plates;

a first plate via contact extending vertically through the plurality of conductive plates and the plurality of insulators, each conductive plate and each insulator located on left and right sides of the first plate via contact, the first plate via contact being electrically coupled to the first group of conductive plates and electrically isolated from the second group of conductive plates;

a second plate via contact extending vertically through the plurality of conductive plates and the plurality of insulators, each conductive plate and each insulator located on left and right sides of the second plate via contact, the second plate via contact being electrically coupled to the second group of conductive plates and electrically isolated from the first group of conductive plates;

first and second pluralities of dielectric spacers, wherein the first group of conductive plates are electrically isolated from the second plate via contact by the first plurality of dielectric spacers, and wherein the second group of conductive plates are electrically isolated from the first plate via contact by the second plurality of dielectric spacers; and first and second pluralities of metal liners, wherein the first group of conductive plates are electrically connected to the first plate via contact by the first plurality of metal liners, and wherein the second group of conductive plates are electrically connected to the second plate via contact by the second plurality of metal liners.

12. The multi-stack metal-insulator-metal (MIM) structure of claim 11, wherein the first and second pluralities of metal liners are of a first material, and the first and second plate via contacts are of a second material, different than the first material.

13. The multi-stack metal-insulator-metal (MIM) structure of claim 11, further comprising:

an innermost insulator located below a bottommost conductive plate of the plurality of conductive plates; and insulating material located inwardly of the innermost insulator, on left and right sides of the plurality of conductive plates and the plurality of insulators, and outward of an outermost one of the plurality of conductive plates.

14. The multi-stack metal-insulator-metal (MIM) structure of claim 13, further comprising an oxide layer outward of the outermost one of the plurality of conductive plates, the insulating material being outward of the oxide layer, wherein the first and second plate via contacts extend upward at least into the oxide layer and extend at least partially downward into the insulating material located inwardly of the innermost insulator.

15. The multi-stack metal-insulator-metal (MIM) structure of claim 14, further comprising metal lines located in the insulating material located inwardly of the innermost insulator, in contact with the first and second plate via contacts.

16. The multi-stack metal-insulator-metal (MIM) structure of claim 11, wherein the first and second plate via contacts extend upward at least into an oxide layer and downward to an inmost surface of the innermost insulator, further comprising:

vias inward of, and electrically contacting, the first and second plate via contacts; and first and second metal lines located in the insulating material inwardly of, and electrically contacting, the vias.

17. A method for fabricating a multi-stack metal-insulator-metal (MIM) structure comprising:

obtaining a precursor structure comprising:

a plurality of conductive plates, including a first group comprising odd-numbered ones of the plates and a second group comprising even-numbered ones of the plates;

a plurality of insulators between the plurality of conductive plates; and an oxide hard mask outward of an outermost one of the plurality of conductive plates;

patterning and etching a contact opening for a second plate via contact;

forming a lateral recess of a first width into the outermost one of the plurality of conductive plates;

depositing a conformal dielectric layer on an outer surface of the precursor structure, sides of the contact opening for the second plate via contact, and surfaces of the lateral recess of the first width;

etching the conformal dielectric layer on exposed horizontal surfaces thereof;

patterning and etching a contact opening for a first plate via contact;

forming a lateral recess of a second first-width into the outermost one of the plurality of conductive plates through the contact opening for the first plate via contact and a next outermost one of the plurality of conductive plates through the contact opening for the second plate via contact, the second width being larger than the first width; and repeating at least the steps of forming the lateral recess of the first width and the lateral recess of the second width, for successively inward pairs of the plurality of conductive plates, until the second group of conductive plates have lateral recesses of the first width adjacent the contact opening for the second plate via contact and lateral recesses of the second width adjacent the contact opening for the first plate via contact, and the first group of conductive plates have lateral recesses of the first width adjacent the contact opening for the first plate via contact and lateral recesses of the second width adjacent the contact opening for the second plate via contact.

18. The method of claim 17, further comprising:

filling the contact opening for the first plate via contact, the contact opening for the second plate via contact, the lateral recesses of the first width, and the lateral recesses of the second width, with dielectric fill;

further opening the contact openings for the first and second plate via contacts to a width that is greater than the first width and less than the second width; and filling the further opened contact openings for the first and second plate via contacts with conductive material to form the first and second plate via contacts such that the first plate via contact is electrically coupled to the first group of conductive plates and electrically isolated from the second group of conductive plates and the second plate via contact is electrically coupled to the second group of conductive plates and electrically isolated from the first group of conductive plates.

19. The method of claim 17, further comprising filling the contact openings for the first and second plate via contacts with conductive material to form the first and second plate via contacts such that the first plate via contact is electrically coupled to the first group of conductive plates and electrically isolated from the second group of conductive plates and the second plate via contact is electrically coupled to the second group of conductive plates and electrically isolated from the first group of conductive plates.

20. A method for fabricating a multi-stack metal-insulator-metal (MIM) structure comprising:

obtaining a precursor structure comprising:

a plurality of conductive plates, including a first group comprising odd-numbered ones of the plates and a second group comprising even-numbered ones of the plates;

a plurality of insulators between the plurality of conductive plates; and an oxide hard mask outward of an outermost one of the plurality of conductive plates;

patterning and etching a contact opening for a first plate via contact;

forming a lateral recess of a given width into the outermost one of the plurality of conductive plates through the contact opening for the first plate via contact;

depositing a conformal dielectric layer on an outer surface of the precursor structure, sides of the contact opening for the first plate via contact, and filling the lateral recess of the given width;

etching the conformal dielectric layer on exposed horizontal surfaces thereof;

patterning and etching a contact opening for a second plate via contact;

forming a lateral recess of the given width into the outermost one of the plurality of conductive plates through the contact opening for the second plate via contact and a next outermost one of the plurality of conductive plates through the contact opening for the first plate via contact;

filling the lateral recess in the outermost one of the plurality of conductive plates that was formed through the contact opening for the second plate via contact and the lateral recess in the next outermost one of the plurality of conductive plates that was formed through the contact opening for the first plate via contact with oxide plugs;

repeating, for successively inward pairs of the plurality of conductive plates, at least the steps of forming the lateral recess of the given width through the contact opening for the first plate via contact, depositing the conformal dielectric layer, forming the lateral recess of the given width into the outermost one of the plurality of conductive plates through the contact opening for the second plate via contact and the next outermost one of the plurality of conductive plates through the contact opening for the first plate via contact, and filling the lateral recess in the outermost one of the plurality of conductive plates that was formed through the contact opening for the second plate via contact and the lateral recess in the next outermost one of the plurality of conductive plates that was formed through the contact opening for the first plate via contact with oxide plugs, until the second group of conductive plates have lateral recesses filled with the oxide plugs adjacent the contact opening for the second plate via contact and lateral recesses filled with the conformal dielectric adjacent the contact opening for the first plate via contact, and the first group of conductive plates have lateral recesses filled with the oxide plugs adjacent the contact opening for the first plate via contact and lateral recesses filled with the conformal dielectric adjacent the contact opening for the second plate via contact;

removing the oxide plugs to form gaps; and filling the gaps with contact metal.

\* \* \* \* \*